(12) United States Patent
Houston

(10) Patent No.: US 6,703,673 B2
(45) Date of Patent: Mar. 9, 2004

(54) SOI DRAM HAVING P-DOPED POLY GATE FOR A MEMORY PASS TRANSISTOR

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 8 days.

(21) Appl. No.: 10/142,336

(22) Filed: May 9, 2002

(65) Prior Publication Data

US 2002/0180069 A1 Dec. 5, 2002

Related U.S. Application Data

(62) Division of application No. 08/862,449, filed on May 23, 1997, now Pat. No. 6,424,016.
(60) Provisional application No. 60/018,300, filed on May 24, 1996.

(51) Int. Cl.[7] .............................................. H01L 29/786
(52) U.S. Cl. ...................... 257/407; 257/296; 257/350; 257/71
(58) Field of Search ................................ 257/407, 296, 257/350, 71

(56) References Cited

U.S. PATENT DOCUMENTS

| | | | |
|---|---|---|---|
| 3,673,471 A | 6/1972 | Klein | 257/407 |
| 4,841,346 A | 6/1989 | Noguchi | 257/407 |
| 4,888,631 A | 12/1989 | Azuma | 257/71 |
| 5,164,805 A | 11/1992 | Lee | 257/407 |
| 5,256,894 A | 10/1993 | Shino | 257/757 |
| 5,714,771 A | 2/1998 | Misawa | 257/72 |
| 5,740,099 A | 4/1998 | Tanigawa | 257/350 |

FOREIGN PATENT DOCUMENTS

JP  6-151854  5/1994

*Primary Examiner*—Jerome Jackson
(74) *Attorney, Agent, or Firm*—Wade James Brady, III; Frederick J. Telecky, Jr.

(57) ABSTRACT

An integrated circuit including a DRAM is disclosed, wherein the DRAM includes a memory array including a plurality of pass gate transistors and a plurality of memory elements. The pass gate transistors include a gate material selected to provide a substantially near mid-gap work function or greater. The DRAM also includes a peripheral area including a plurality of logic transistors. In a preferred embodiment the pass gate transistors are silicon-on-insulator transistors.

13 Claims, 5 Drawing Sheets

SOI DRAM HAVING P-DOPED POLY GATE FOR A MEMORY PASS TRANSISTOR

This application is a division of application Ser. No. 08/862,449, filed May 23, 1997 U.S. Pat. No. 6,424,016, which claims priority to provisional Application No. 60/018,300, filed May 24, 1996.

BACKGROUND OF THE INVENTION

1. Field of the Invention

This invention relates to a the design of DRAMs using Silicon on Insulator (SOI) technology and more particularly to the design of fully depleted memory pass transistors in the DRAM in combination with a P-doped polysilicon gate.

2. Description of the Prior Art

SOI is good for DRAM for several reasons. One reason is that SOI has lower collection volume for charge generated by an alpha particle or a cosmic ray. Such charge can upset the memory cell, so the smaller collection volume of SOI is desirable. SOI also reduces the capacitance on the bit line so less charge is needed to generate an equivalent signal on the bit line relative to bulk DRAM. Also reduced junction area in the memory cell should give lower leakage which translates to longer retention time. All these features, lower collection volume, lower leakage and lower capacitance, are advantages of SOI.

There are also potential difficulties in using SOI for DRAM. These include cost, yield, and floating body effects. SOI wafers cost more than bulk silicon wafers, so it is important to keep the SOI processing cost low. Yield on SOI wafers is expected to improve as the material quality continues to be improved. Floating body effects can improve performance for logic circuits, but can also amplify collected charge (as from alpha particle strikes) or increase leakage currents. So there is a need for a low cost SOI process with reduced floating body effects.

The basic memory cell in a DRAM is a pass and a storage element (capacitor). The full DRAM includes an array of memory cells, and peripheral circuitry to control storage and retrieval of data into and from the memory array. The DRAM may be included with other circuitry in an integrated circuit. The process for a DRAM must encompass the requirements for the memory array pass gate and the peripheral transistors. The requirements for the pass gate transistor distinguish the design of transistors for DRAMs from logic or SRAMs. The pass gate must have very low leakage. This requires relatively high threshold voltage. It is also desirable for the pass gate transistor to have low source capacitance to help keep the bit line capacitance low. For charge transfer, it is usual to have a boosted word line voltage, which leads to thicker gate oxide for reliability. The pass gate transistor does not need to have high drive current. The pass gate transistor is usually N channel with an N doped polysilicon gate. There are some advantages to N polysilicon and the N channel has higher drive because of the higher mobility of electrons.

Peripheral transistors have requirements similar to standard logic transistors. They generally will be designed with lower VT than the pass transistor. But to reduce cost, it is usual to have the peripheral transistor with the same gate oxide and single N polysilicon that is used for the pass transistor. Also silicide is not used to reduce cost.

Thus the design requirements for the peripheral transistor of a DRAM also may be different from the usual design requirements for standard logic. Nevertheless, we will sometimes refer to the DRAM peripheral transistors as logic transistors.

There are different types of SOI transistors, and the choice of the SOI transistor type will affect the SOI DRAM performance. SOI transistors can be classified as fully depleted or partially depleted. Some SOI transistors may also be classified as nearly fully depleted. These are fully depleted when on and partially depleted when off. For a given channel doping SOI transistors go from partially depleted to fully depleted as the silicon film thickness is thinned. The partially depleted transistor characteristics, including determination of threshold voltage, are very much like bulk transistors except for the floating body effects. Fully depleted transistors have some unique characteristics, and have reduced floating body effects. For fully depleted transistors, the range of threshold voltage is limited by the gate work function and silicon film thickness. As the channel doping is increased to increase the threshold voltage the transistor transitions from fully depleted to partially depleted. There is an upper limit of threshold voltage for fully depleted SOI transistors for a given silicon film thickness and gate work function. For logic, it has been proposed to use a mid band-gap work function to raise the threshold voltage of both n and p-channel transistors. Polysilicon gate with "opposite" doping (p type for n-channel and n type for p-channel) has also been proposed combined with accumulation transistor mode design to get suitable threshold voltages for logic or SRAM circuits.

In addition to the difficulty of selecting desirable threshold voltage, fully depleted transistors suffer from higher source/drain resistance because of the thinner silicon film. This is particularly true when silicide is used since there is high contact resistance if the silicide consumes the full silicon film thickness. For these reasons most commercial work on SOI, including work on SOI DRAM, has emphasized partially depleted transistors.(See H. S. Kim et al. 1995 Synmposium on VLSI Technology Digest of Technical Papers pp. 143, 1995)

For SOI DRAM, the thinner silicon film associated with fully depleted or near fully depleted transistors has several advantages. These include a smaller junction area leading to smaller junction leakage and smaller junction capacitance. The thinner silicon film also provides a smaller volume for charge generation from ion strikes. The fully depleted transistor also has reduced floating body effects that can increase leakage in pass transistors and lead to variation of threshold voltages which would be deleterious to sense amplifiers. Further, the higher series resistance of fully depleted transistors is not significant in the DRAM array, especially since silicide is generally not used. However, the threshold voltage of a fully depleted n-channel SOI transistor with n-poly gate is too low for DRAM pass transistor application.

SUMMARY OF THE INVENTION

It is therefore a general object of the present invention to design an SOI pass transistor for a DRAM that has a high threshold voltage and reduced floating body effects.

It is a further object of the present invention to integrate the above DRAM pass gate transistor with peripheral transistors with suitable characteristics.

These and other objects of the invention will become apparent to those of ordinary skill in the art having reference to the following specification, in conjunction with the drawings.

In this invention, the gate material is chosen to have a higher work function to increase the threshold voltage of the DRAM array pass transistor relative to the use of n-poly for n-channel transistors. This reduces the floating body induced leakage under dynamic conditions. This also allow the use of fully depleted or nearly fully depleted transistors in the array. These can be combined with fully depleted transistors in the periphery. Alternatively, a different thickness silicon film can be used in the array verses in the periphery, such as by selective thinning, to allow fully depleted transistors in the array and partially depleted transistors in the periphery. The use of SOI transistors in the array and bulk transistors in the periphery is also possible.

In a preferred embodiment the pass transistors are fully depleted P channel transistors operating in the inversion mode with N type polysilicon gates. The periphery has fully depleted P channel accumulation mode transistors with N doped polysilicon gates and fully depleted N channel inversion mode transistors also with N type polysilicon gates.

In another embodiment, the pass transistors are fully depleted N channel inversion mode transistors with P type polysilicon gates, wherein the periphery transistors are fully depleted N channel accumulation mode transistors with P type polysilicon gates in addition to fully depleted P channel inversion mode transistors also with P type polysilicon gates.

In another embodiment, the pass transistors are fully depleted P channel inversion mode transistors with N type polysilicon gates. The peripheral transistors are partially depleted P channel inversion mode transistors with N type polysilicon gates in addition to partially depleted N channel inversion mode transistors with N type polysilicon gates. The pass transistors are made with thinner silicon film than the peripheral transistors. Optionally some of the peripheral transistors such as in the sense amps may also be fully depleted.

In yet another embodiment the silicon insulator and bulk transistors are used on the same integrated circuit. This would be done with masked SIMOX or by other techniques, such as epitaxial lateral overgrowth. Here the transistors in the array would be made fully depleted with SOI and the peripheral transistors would be fabricated in bulk silicon. Selectively, some of the peripheral transistors could also be put on SOI.

DESCRIPTION OF THE PREFERRED EMBODIMENT

Figure 1:
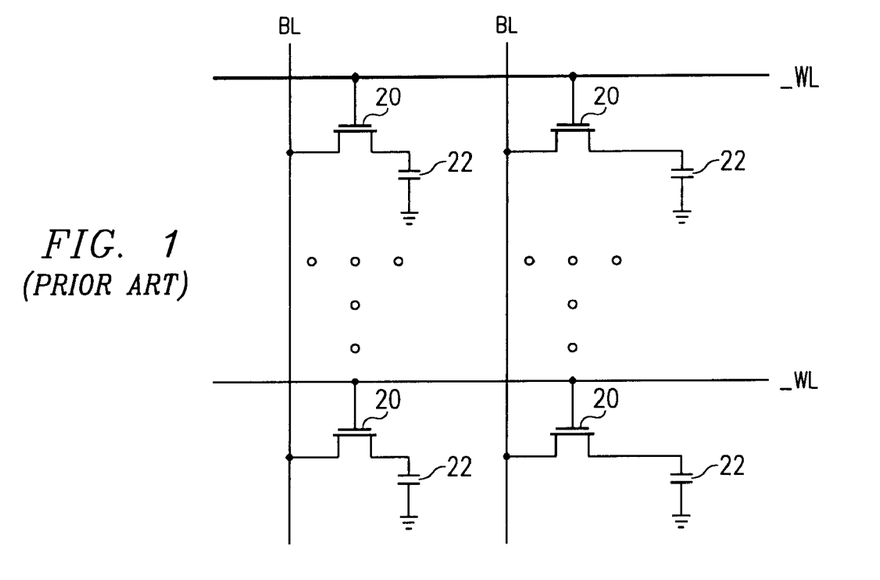
FIG. 1 is an illustration of a prior art DRAM memory array.

FIG. 1 is a typical DRAM memory array which shows a separate pass transistor 20 associated with each memory cell 22. Word lines WL and bit lines BL are also attached to each pass transistor 20 in a known manner. In addition to the memory array as shown in FIG. 1 each DRAM also has peripheral area outside the memory array. The peripheral area includes various logic circuits including for example address decoding circuits, wordline drivers, sense amplifiers, and input/output circuits.

Figure 2:
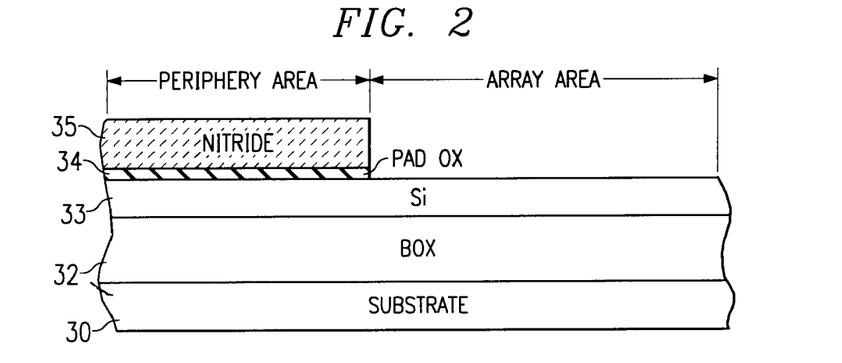
FIGS. 2–4 show a process flow for arriving at a SOI structure having a thinner silicon area in the array area than in the periphery area.
Figure 3:
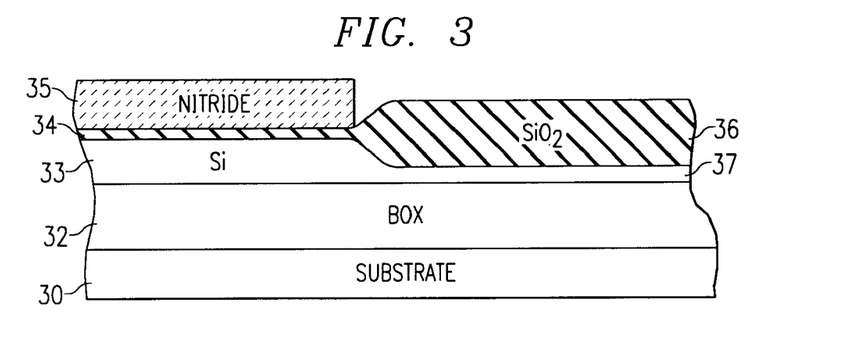
Figure 4:
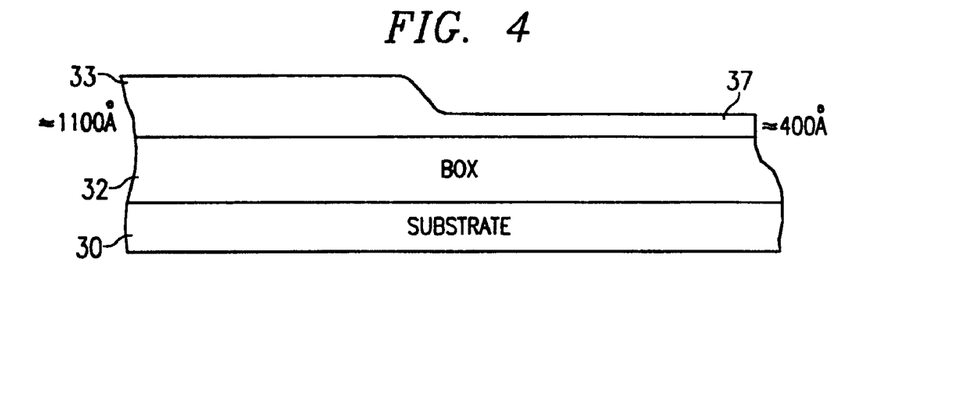

FIGS. 2–4 illustrate a process flow for a silicon on insulator (SOI) structure wherein the silicon layer is thinner in the memory array area than it is in the peripheral area of the DRAM. In FIG. 2, the first step is to provide a silicon-on-insulator structure comprised of silicon layer 33 on an oxide layer 32 which is on a substrate 30. This SOI structure can be fabricated in any of a variety of known processes such as bonding with etch back, SIMOX, or epitaxial lateral overgrowth. The thickness of silicon layer 33 is desired to be approximately 60 nm or greater to provide for partially depleted transistors in the periphery area. A nitride layer 35 on top of a pad oxide layer 34 is used to mask the periphery area from the array area. As shown in FIG. 3, the exposed array area is oxidized to form $SiO_2$ layer 36. The $SiO_2$ layer 36, the nitride mask 35 and pad oxide 34 are removed leaving the structure shown in FIG. 4. The silicon in the memory array area has been selectively thinned to provide a thickness $t_{si}$ of approximately 30–80 nm. This thickness should provide for fully depleted pass transistors in the memory array area upon further processing. Alternate means of obtaining seletively different silicon film thickness for pass and periphery transistors include the use of selective epi, and bonding with a selectively contoured device wafer. For the latter, various means of contouring can be used, including selective oxidation and etching. Use of bonding with a selectively contoured device wafer has the advantage of presenting a substantially planar surface for subsequent processing.(See U.S. Pat. No. 5,436,173).

Figure 5:
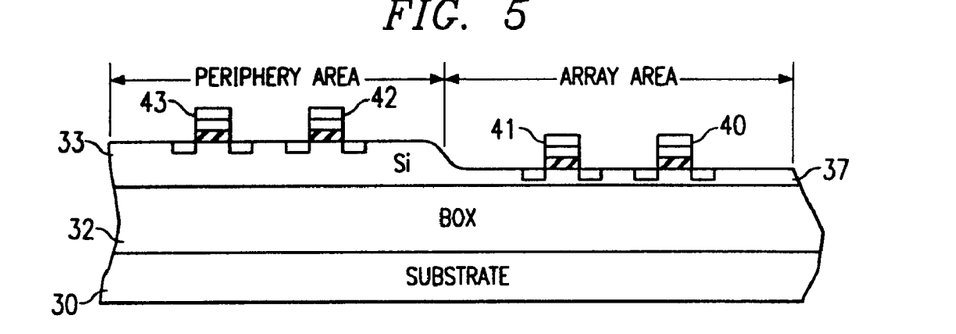
FIG. 5 shows one preferred embodiment of the current invention.

As shown in FIG. 5, after processing of the SOI structure, with thinned silicon for fully depleted transistors in the array area, a plurality of pass transistors 40 and 41 are formed in the array area and a plurality of logic transistors 42 and 43 are formed in the periphery of the DRAM. Selected peripheral transistors may also be formed in areas of thinner silicon. The plurality of transistors 41 and 42 are formed in accordance with normal processing except that p-doped polysilicon is used in the gate material of the n-channel pass transistors in the array area instead of n doped polysilicon of the prior art. The p-doped polysilicon gate material is chosen to have a higher work function than the standard n-doped polysilicon gate for the n-channel pass transistor. For p-channel pass transistors, an n-doped polysilicon doped gate material would be used to provide the higher threshold voltage.

Instead of using the p-doped polysilicon gate material a metal such as tungsten or titanium nitride (having a near mid-gap work function) could be chosen to give a higher gate threshold voltage for the pass transistors, than the prior art. Multilayer gate material may be used to get the desired work function combined with other desired characteristics. For example, p-doped poly may be layered with tungsten to reduce resistance, or TiN may be layered with n-doped polysilicon.

With the SOI structure shown in FIG. 5, the silicon layer 37 in the array area could be either fully depleted or partially depleted depending on the exact doping and Si film thickness $t_{si}$. It is preferable to use a thin silicon film (less than 80 mm) for reduced junction area, leading to a fully depleted channel for the pass gate transistors of the array area.

For optimal performance of the pass transistors in the array area and the logic transistors in the periphery, different gate material and/or different film thickness could be used in the array vs. the periphery, as illustrated in FIG. 5 and discussed above. This is because the transistors in both areas can be optimized independently.

Figure 6:
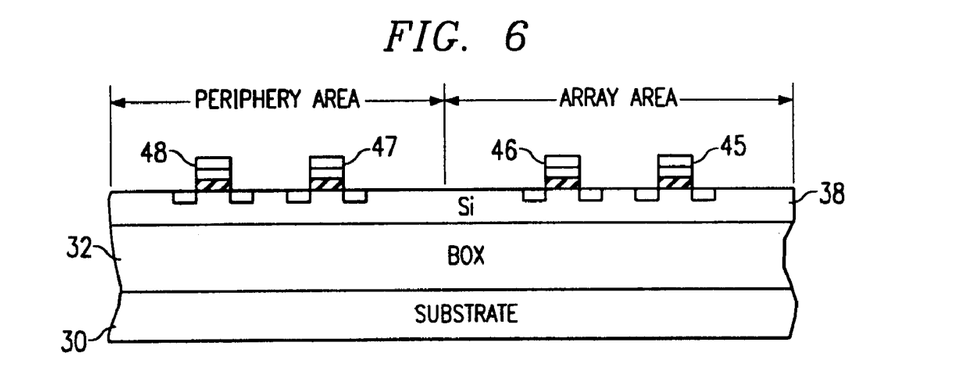
FIG. 6 shows an alternate preferred embodiment of the current invention.

However, for optimal processing efficiency, the same gate material and film thickness $t_{si}$ would be used for both the array area and periphery to reduce cost. An SOI structure with a plurality of pass transistors 45 and 46 in the array area and a plurality of logic transistors 47 and 48 in the periphery of the DRAM is shown in FIG. 6. One less lithography step would be required to produce the SOI structure in FIG. 6 as compared to the SOI structure of FIG. 5 due to uniform layer 38 providing a uniform silicon film thickness $t_{si}$ for all transistors throughout the DRAM device. Following are three examples of a DRAM having a uniform silicon channel thickness $t_{si}$ of 60 mm, in accordance with FIG. 6, wherein the pass and periphery transistors use n-doped polysilicon gates for all transistors in the first example and p-doped polysilicon gates for all transistors in the second and third examples given below.

FIRST EXAMPLE

Uniform thickness for Silicon channel: 60 mm

Single gate material: n+ polysilicon (1) Pass transistors: fully depleted p-channel transistors with 1E17 n type doping in channel. (Vt=~-1.2V)

(2) n-channel periphery transistors: partially depleted transistors with 6E17 p type doping in channel. (Vt=~-0.5V)

(3) p-channel periphery transistors: fully depleted transistors with 3E16 p type doping in channel. (accumulation mode, Vt=~-0.5V)

SECOND EXAMPLE

Uniform thickness for Silicon channel: 60 mm

Single gate material: P+polysilicon (1) Pass transistors: fully depleted n-channel transistors with 1E17 p type doping in channel. (Vt=~1.2V)

(2) n-channel periphery transistors: fully depleted transistors with 3E16 n type doping in channel. (Accumulation mode, Vt=~0.5V)

(3) p-channel periphery transistors: partially depleted transistors with 6E17 n type doping in channel. (Vt=~-0.5V)

THIRD EXAMPLE

Uniform thickness for Silicon channel: 60 mm

Single gate material: p+polysilicon (1) Pass transistors: fully depleted n-channel transistors with 1E16 n type doping in channel. (Accumulation mode, Vt=~0.8V)

(2) n-channel periphery transistors: fully depleted transistors with 3E16 n type doping in channel. (Accumulation mode, Vt=~-0.5V)

(3) p-channel periphery transistors: partially depleted transistors with 6E17 n type doping in channel. (Vt=~-0.5V)

As stated above, it is possible to have fully depleted pass transistors in the array and partially depleted logic transistors in the periphery using different silicon film thicknesses. Another option is to use different gate materials. An example of this is as follows:

FOURTH EXAMPLE

Uniform thickness for Silicon channel: 60 nm (1) Pass transistors: fully depleted p-channel transistors having n-doped poly gates with 1E17 n type doping in channel. (Vt=~-1.2V)

(2) n-channel periphery transistors: partially depleted transistors having n-doped poly gates with 6E17 p type doping in channel. (Vt=~0.5V)

(3) p-channel periphery transistors: partially depleted transistors having p-doped poly gates with 6E17 n type doping in channel. (Vt=~-0.5V)

It should be recognized that the above examples were given knowing that the devices can be optimized with channel profiling and source/drain engineering. Therefore, the invention is not intended to be limited to the above examples.

The p-channel pass transistor has an advantage relative to the n-channel pass for SOI because of the lower parasitic bipolar gain for a p-n-p structure vs a n-p-n structure. Also, if opposite gate doping is used (n-poly for p-channel or p-poly for n-channel) the n-poly gate of the p-channel pass transistor has the advantage of lower resistance. Further, as gate oxides are thinned, n-poly will have an advantage of not needing to be concerned with boron penetration through the gate oxide as would be the case for p-poly.

Experimental Results

Both partially and fully depleted pass transistors were designed and fabricated on SIMOX substrates. Using a p+gate design, $V_{th}$=1V and $I_{off}$<1 fA/mm was achieved for ultra thin film SOI pass transistors. With less than 1 fA/mm off-state leakage design, the SOI pass transistor should provide excellent DRAM cell retention time and low standby power. In addition, the SOI pass transistors were found to have a high DRAM charging efficiency (>80% for partially depleted devices and >95% for fully depleted devices) than the bulk pass transistor (80%) because of the elimination of the body effect. The higher charging efficiency allows SOI pass transistors to reduce the wordline voltage during the charging state, increase the gate oxide integrity and decrease the active power.

$V_{th}$ Design of the Pass Transistors

Figure 7:
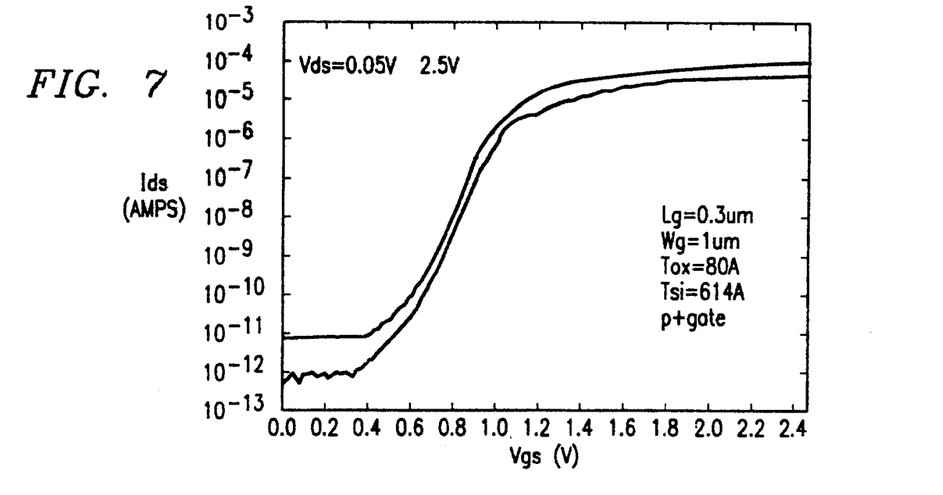
FIG. 7 shows the I–V characteristics of a fully depleted SOI DRAM pass transistor.
Figure 8:
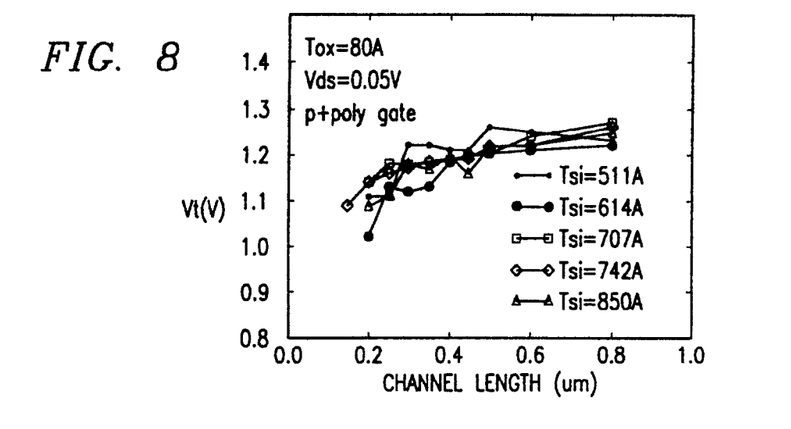
FIG. 8 shows the linear threshold voltage of SOI DRAM pass transistors with various starting SOI film thicknesses.
Figure 9:
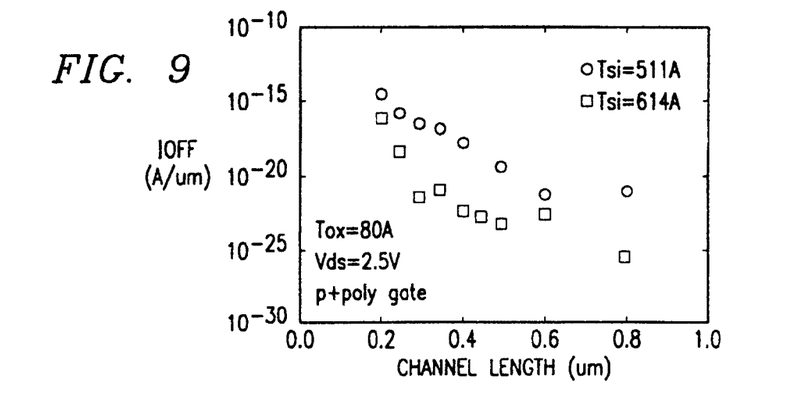
FIG. 9 shows the subthreshold leakage current, Ioff, of SOI DRAM pass transistors on two different starting SO films.
Figure 10:
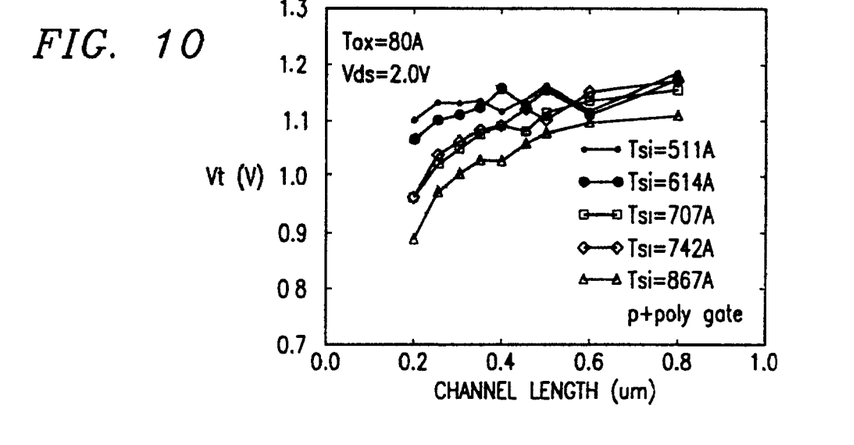
FIG. 10 shows the saturation Vth of SOI DRAM pass transistors with various starting SOI film thicknesses.
Figure 11:
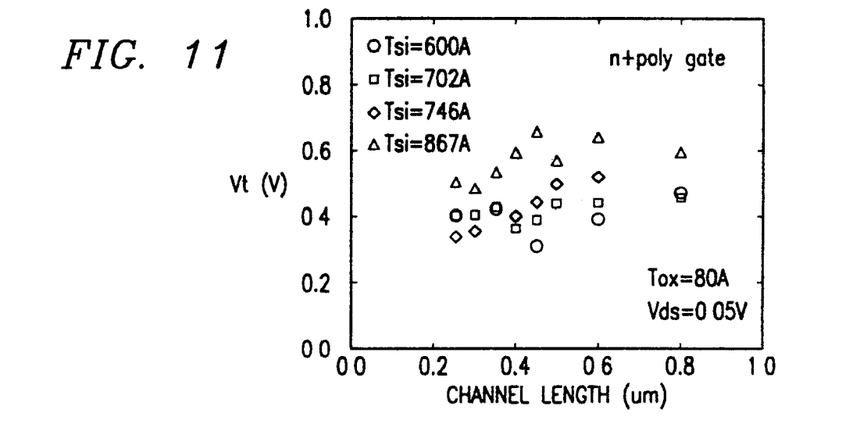
FIG. 11 shows the linear Vth of SOI DRAM pass transistors with various starting SOI film thicknesses.
Figure 12:
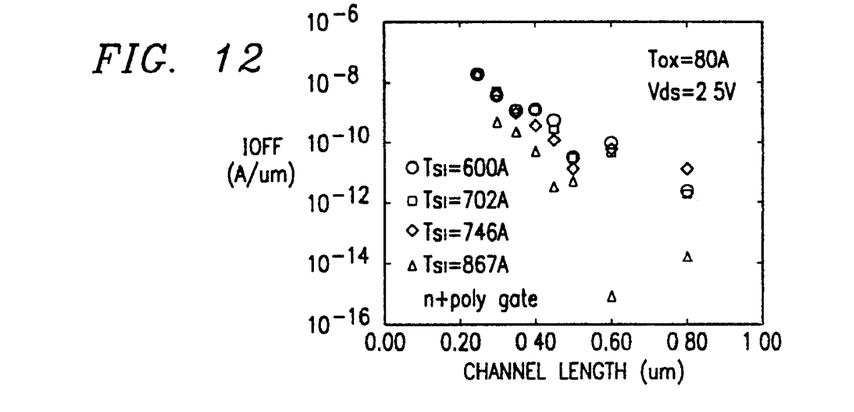
FIG. 12 shows the subthreshold leakage current, Ioff, of SOI DRAM pass transistor swith various starting film thicknesses.

FIG. 7 shows the I–V characteristics of a fully depleted SOI DRAM pass transistor with p+gate design. The Vth implant was BF2, 40 KeV, 8E11 dose. The LDD implant was As, 40KeV, 3E14 dose and the p+ gate was formed by 10KeV, 3E15 dose Boron implant and annealed during the junction sequence. FIG. 8 shows the linear $V_{th}$ of DRAM pass transistors for various SOI film thicknesses using p+ gate design. The Vth implant for all the transistors is BF2, 40 KeV, 1E12 dose and the LDD implant is As, 40KeV, 4E13 dose, and the channel width is 1.0 um. The subthreshold leakage current, $I_{off}$, at $V_{ds}$=2.5V of these transistors is shown in FIG. 9. As shown in the FIG. 8, the $V_{th}$ of the transistors is 1.1~1.2V and does not change significantly as the SOI film thickness varies. The short channel effect on these transistors is also very small, due to the thin SOI film thicknesses. The leakage current I at $V_{ds}$=2.5V is below 1 fA/mm, which would improve the retention of the DRAM cell and reduce the stand-by power significantly. In the saturation condition, the $V_{th}$ roll-off is larger and is a function of the SOI film thicknesses, shown in FIG. 10. For a comparison, all the n+ gate design n-channel transistors have $V_{th}$ below 0.6V and $I_{off}$ is on the order of nA/mm. FIG. 11 and FIG. 12 show the $V_{th}$ and $I_{off}$ of n+ gate transistors as a function of SOI film thicknesses. As the SOI film thickness is larger than 60 mm, the subthreshold slope of the devices at $V_{ds}$=2.5V is less than 70 mV/dec which is an indication that the devices are partially depleted.

It is commonly considered a draw back of fully depleted SOI that the Vt depends on Si film thickness, adding another source of Vt variation. But with the very low channel doping with opposite gate type, this variation is very small. Further, the variation of Vt with temperature is smaller for fully depleted SOI than for partially depleted or bulk.

Charging Characteristics of the Pass Transistors

Figure 13:
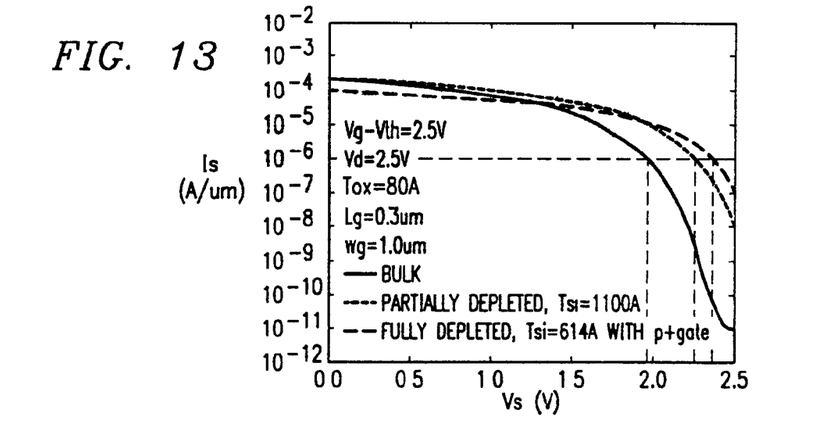
FIG. 13 shows the channel current as a function of source node voltage for bulk and SOI DRAM pass transistors.
Figure 14:
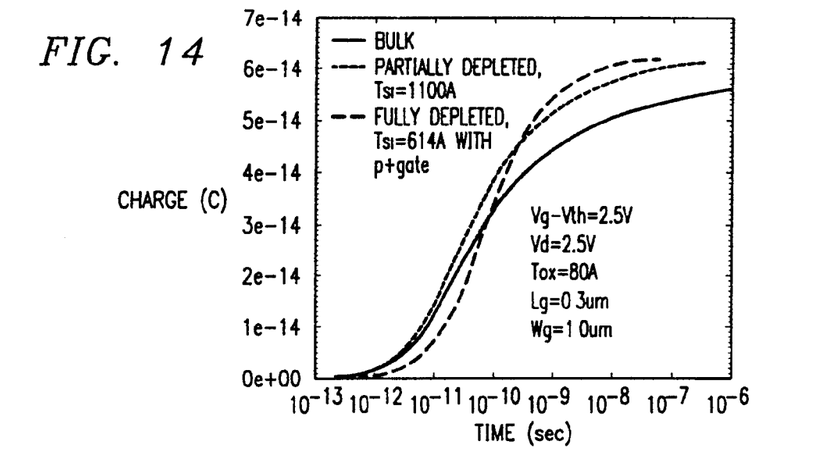
FIG. 14 shows the charging characteristics of a 25 fF capacitor for bulk and SOI DRAM pass transistors.
Figure 15:
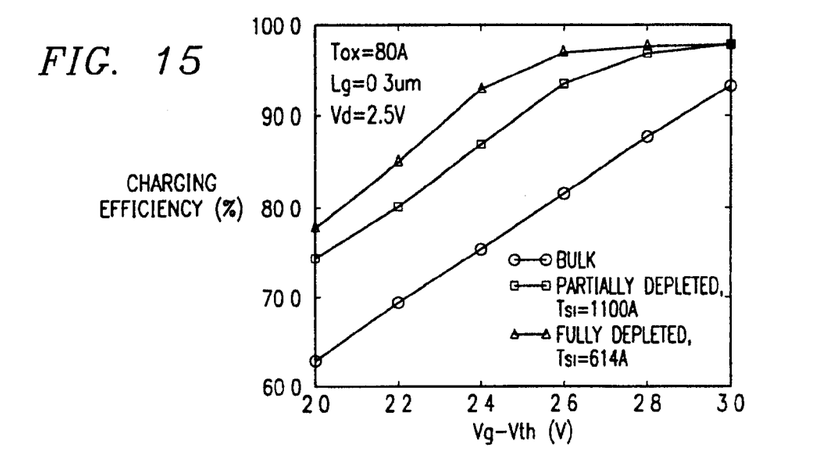
FIG. 15 shows the charging efficiency as a function of gate voltage for bulk and SOI DRAM pass transistors.

The bulk pass transistors suffer from the increase in Vt threshold voltage caused by the body effect during the capacitor charging state, so the wordline voltage has to be boosted to $V_{WL}=V_{th}+V_{ds}+\_V$, where \_V compensates for the $V_{th}$ increasing during the charging. Reducing the body effect becomes a major issue in bulk pass transistor design. On the other hand, the body potential of the partially depleted SOI transistors will follow the source node potential during the charging because of the floating body effect, so that the body to source potential difference is kept at a substantially constant value. For fully depleted SOI transistors, there is no body potential change since the channel is fully depleted through the entire silicon-filmed thickness. Therefore, the SOI transistors will have a higher charging efficiency compared to the bulk transistors. FIG. 13 shows the channel current as a function of source node voltage for the bulk and SOI transistors. If the charging current is designed to be 1 mA/mm, then the charging efficiency, defined as the ratio of source voltage at 1 mm to the drain voltage (the bitline voltage), the charging efficiency is 80% for bulk transistors and 88% and 98% for partially and fully depleted SOI transistors, respectively. The higher charging efficiency of SOI shows charging characteristics of a 25 fF capacitor. The bulk transistor shows a faster charging at below 0.1 ns due to its higher initial current. The SOI transistors show faster charging characteristics for time greater than 0.1 ns. The fully depleted SOI transistor can charge ten times more charge than bulk transistor at ins, which is the typical charging time for a DRAM cell. For the bulk pass transistors to reach the same charging efficiency as SOI transistors, one has to increase the wordline voltage during the charging. FIG. 15 shows the charging efficiency as a function of gate voltage for the bulk and SOI DRAM pass transistors. To reach 90% charging efficiency, the gate voltage of the bulk transistor has to be 0.6 V higher than that of thin film SOI transistors. The increased wordline voltage will worsen the gate oxide integrity and is also not favorable for the low power operation.

In summary, we have demonstrated a p+ gate SOI DRAM pass transistor design on ultra thin SOI films which has below 1 fA/mm subthreshold leakage current. In addition, we have shown that the fully depleted SOI pass transistors have higher charging efficiency compared to bulk pass transistors. The higher charging efficiency allows SOI pass transistors to reduce the wordline voltage during the charging state and increase the gate oxide integrity. By using a p+ gate design for the pass transistors of the DRAM, we have achieved less than 1 fA/mm of subthreshold leakage current on ultra thin SOI film thicknesses ranging from 400A to 800A.

While the invention has been shown and described with respect to particular embodiments, it will be understood by those skilled in the art that the foregoing and other changes in form and detail may be made therein without departing from the spirit and scope of the invention.

What is claimed is:

1. An integrated circuit including a dynamic random access memory circuit comprising:
   a memory array including a plurality of pass gate transistors and a plurality of memory elements, wherein said pass gate transistors comprise devices having a first conductivity type channel and gate regions having a second conductivity type, wherein said pass gate transistors have fully depleted channel regions; and
   a peripheral area including a plurality of logic transistors wherein said logic transistors have partially depleted channel regions.

2. The integrated circuit of claim 1 wherein said pass gate transistors are p-channel transistors with N+ doped polysilicon gate regions.

3. The integrated circuit of claim 2 wherein said N+ doped polysilicon gate regions are clad with a metal layer.

4. The integrated circuit of claim 3 wherein said metal layer comprises tungsten.

5. The integrated circuit of claim 2 wherein a silicide layer is formed on said N+ polysilicon gate regions.

6. An integrated circuit including a dynamic random access memory circuit comprising:
   a memory array including a plurality of pass gate transistors and a plurality of memory elements, wherein said pass gate transistors comprise devices having a first conductivity type channel and gate regions having a second conductivity type; and
   a peripheral area including a plurality of logic transistors;
   wherein said pass gate transistors are p-channel transistors with N+ doped polysilicon gate regions.

7. The integrated circuit of claim 6 wherein said N+ doped polysilicon gate regions are clad with a metal layer.

8. The integrated circuit of claim 7 wherein said metal layer comprises tungsten.

9. The integrated circuit of claim 6 wherein a silicide layer is formed on said N+ polysilicon gate regions.

10. An integrated circuit including a dynamic random access memory circuit comprising:
    a memory array including a plurality of pass gate transistors and a plurality of memory elements, wherein said pass gate transistors comprise devices having a first conductivity type channel and gate regions having a second conductivity type; and
    a peripheral area including a plurality of logic transistors;
    wherein said pass gate transistors are silicon on insulator transistors.

11. An integrated circuit including a dynamic random access memory circuit comprising:
    a memory array including a plurality of pass gate transistors and a plurality of memory elements, wherein said pass gate transistors comprise devices having a first conductivity type channel and gate regions having a second conductivity type; and a peripheral area including a plurality of logic transistors;

wherein a gate material of said pass gate transistors is different from a gate material of said logic transistors.

12. An integrated circuit including a dynamic random access memory circuit comprising:

a memory array including a plurality of pass gate transistors and a plurality of memory elements, wherein said pass gate transistors comprise devices having a first conductivity type channel and gate regions having a second conductivity type; and a peripheral area including a plurality of logic transistors;

wherein a gate material of said pass gate transistors is a different thickness from a gate material of said logic transistors.

13. An integrated circuit including a dynamic random access memory circuit comprising:

a memory array including a plurality of pass gate transistors and a plurality of memory elements, wherein said pass gate transistors comprise devices having a first conductivity type channel and gate regions having a second conductivity type; and a peripheral area including a plurality of logic transistors;

wherein said pass gate transistors have respective channel regions and said gate regions have a work function near the middle of the band gap of said channel regions.

* * * * *